United States Patent [19]

Harada et al.

[11] Patent Number: 5,597,665
[45] Date of Patent: Jan. 28, 1997

[54] POROUS METAL BODY, PROCESS FOR PRODUCING THE SAME AND BATTERY PLATE FORMED THEREFROM

[75] Inventors: Keizo Harada; Masayuki Ishii; Shosaku Yamanaka, all of Itami, Japan

[73] Assignee: Sumitomo Electric Industries, Ltd., Japan

[21] Appl. No.: 544,098

[22] Filed: Oct. 17, 1995

[30] Foreign Application Priority Data

Dec. 15, 1994 [JP] Japan .................................. 6-311852

[51] Int. Cl.$^6$ .................................................. H01M 4/80
[52] U.S. Cl. ................... 429/235; 429/245; 29/2; 427/203; 427/404; 428/547
[58] Field of Search .................... 429/235, 245; 29/2; 427/203, 205, 376.8, 404; 428/547, 560

[56] References Cited

U.S. PATENT DOCUMENTS

| | | | |
|---|---|---|---|
| 4,251,603 | 2/1981 | Matsumoto et al. | 429/235 X |
| 5,085,956 | 2/1992 | Imhof et al. | 429/235 X |
| 5,156,899 | 10/1992 | Kistrup et al. | 429/235 X |
| 5,196,232 | 3/1993 | Kitazaki et al. | 427/376.8 X |
| 5,232,788 | 8/1993 | Timsit et al. | 428/560 |

FOREIGN PATENT DOCUMENTS

| | | |
|---|---|---|
| 17554 | 9/1963 | Japan . |
| 174484 | 10/1982 | Japan . |
| 28163 | 1/1992 | Japan . |

*Primary Examiner*—Stephen Kalafut
*Attorney, Agent, or Firm*—Bierman and Muserlian

[57] ABSTRACT

A porous metal body is produced by forming a coating film of one or more metal capable of forming a eutectic alloy at temperatures not higher than the melting point of Al on a foamed resin skeleton having a three-dimensional network structure according to the plating, vapor deposition, sputtering, CVD or other vapor phase process, impregnating the foamed resin having the coating film formed thereon with a paste comprising powdery Al, a binder and an organic solvent as principal components to thereby obtain a paste-coated composite and heating the composite at a temperature ranging from 550° C. to 750° C. in a nonoxidizing atmosphere. The resultant porous metal body has a large effective surface area and a high space utilization factor and exhibits excellent performance in uses in filters and battery plates.

8 Claims, 3 Drawing Sheets

SKELETAL SECTIONAL
FORM AFTER
APPLICATION OF
POWDERY Al

SKELETAL SECTIONAL
FORM AFTER
SINTERING (a)                          (b)

SKELETAL SECTIONAL
FORM AFTER
APPLICATION OF
POWDERY Al

SKELETAL SECTIONAL
FORM AFTER
SINTERING

DISTANCE ALONG
SECTIONAL DIRECTION

ABOUT 20μm

POROUS METAL BODY, PROCESS FOR PRODUCING THE SAME AND BATTERY PLATE FORMED THEREFROM

BACKGROUND OF THE INVENTION

1. Field of the Invention

The present invention relates to a porous metal body for use as a battery plate (i.e., a plate used in a battery) or a carrier of any of various substances.

2. Description of the Prior Art

Porous metal bodies each provided with interconnected pores at a porosity of 90% or higher are commercially available which include, for example, CELMET (trade name) produced by Sumitomo Electric Industries, Ltd. This is a porous metal body composed of metallic Ni, being used in various types of filters and plates for secondary alkaline batteries.

The above porous metal bodies have been produced by either the plating process as described in, for example, Japanese Patent Laid-Open No. 174484/1982 or the sintering process as described in, for example, Japanese Patent Publication No. 17554/1963. The plating process comprises coating the skeletal surface of a foamed resin such as urethane foam with carbon powder or the like to thereby render the foamed resin conductive, electrodepositing a metal thereon by the electroplating process and thereafter burning the foamed resin and carbon or the like to thereby obtain a porous metal body. On the other hand, in the sintering process as described in Japanese Patent Publication No. 17554/1963, a porous metal body is produced by impregnating the skeletal surface of a foamed resin such as urethane foam with a slurried metal powder to thereby obtain a slurry-coated composite, drying the composite and heating the dried composite to thereby sinter the metal powder.

Also, a process for producing a porous Al body by casting has been reported (Nikkei Mechanical, 1981/1/5 issue, pages 22 and 23). In this casting-based process, first, a slurry gypsum is cast into a foamed resin such as urethane foam and set to thereby prepare a gypsum mold having a two-dimensional network structure. An Al melt is then cast into the mold, and the gypsum mold is finally removed to thereby obtain a porous Al body.

With respect to major uses of the above porous metal body, recent attention is being drawn to the use as a plate for secondary battery. Actually, the above porous Ni body is being employed in Ni—Cd and Ni-hydrogen secondary batteries. In recent years, a secondary lithium battery is being high-lighted as being suitable for meeting the demand for battery capacity increase. In this secondary lithium battery, the material composing the positive-electrode plate is required to have oxidation and electrolyte resistances because the cell voltage exceeds 3 V. From the viewpoint of the material quality, the porous Ni body cannot be used. Currently, an aluminum foil is being employed as the material for composing the positive-electrode plate, and the use of a porous Al body therefor has been proposed (Japanese Patent Laid-Open No. 28163/1992). In this laid-open specification, lithium or a lithium alloy is used as an active substance of a negative electrode, and it is described that causing the positive-electrode collector to have a porous structure retards the deterioration of discharge capacity by repeating charging and discharging cycles.

Although the materials of most of the conventional porous metal bodies are composed of Ni, the porous body of Ni cannot occasionally be employed in uses requiring lightweight and corrosion and oxidation resistances. Further, in uses as filters, and carriers for battery plates, etc., in which large effective surface areas are required, the porous body of Ni formed according to the plating process cannot be effectively utilized because its typical skeletal sectional form is hollow as shown in FIG. 2(a), so that there is a substantially dead space such as part A being a useless space. In this figure, numeral 10 represents a metal part. With respect to the porous body of Ni prepared according to the sintering process on the other hand, although its sectional form is as shown in FIG. 2(b) and a hollow dead space as shown in FIG. 2(a) is scarce therein, its configuration has a thin skeleton and its surface area (skeletal periphery in FIG. 2(b)) is small, so that from the viewpoint of effectivity its structure also cannot be highly appreciated.

With respect to the production of the porous body of Al, for example, the plating process cannot be applied thereto because Al plating is practically almost unfeasible. Further, it is very difficult in the sintering process to sinter powdery Al having a strong oxide film formed at its surface under atmospheric pressure, so that the process as described in Japanese Patent Publication No. 17554/1963 cannot directly be applied to the production of the porous body of Al. Still further, in the casting process, it is difficult to obtain a porous body having a large number of pores per unit length, i.e., minute pore diameters in view of the productive characteristics of the process.

Although the primary object is attained by the formation of an electrode layer based on a positive-electrode plate of aluminum foil or the like as currently employed in the secondary lithium battery, a plate material is desired which ensures higher reliability, being free from deterioration of output characteristics and capacity irrespective of the repetition of charge and discharge, and which has excellent adherence to electrode substances. That is, generally, the repetition of charge and discharge a number of times causes the positive electrode as a whole to gradually swell to thereby deteriorate the interfacial contact between the core material and the electrode layer with the result that the conductivity of the electrode per se is deteriorated so as to render the attainment of high current density unfeasible and to shorten the duration of charge and discharge cycle. Further, powder comes off from the plate and causes short-circuit, so that there has been a problem in, for example, reliability. These problems have partly been attributed to the occurrence of a reaction causing lithium ions to enter the crystal lattice at the time of charge and discharge reaction with the result that the crystal lattice of the active substance is swollen or shrunk by doping or dedoping with lithium ions so as to bring about the occurrence of defects in the interfaces between the electrode layer and the collector, between the active substance and the plate and between the active substance and the binder resin. Furthermore, a problem of battery reliability is contemplated which is attributed to the deterioration of the active substance layer resulting from the occurrence of local heat caused by the low heat conductivity of each of the electrode materials such as the active substance.

In the proposal (Japanese Patent Laid-Open No. 28163/1992) in which a porous body of Al is used as a plate for suppressing the falling and peeling of the active substance from the positive electrode and thus for improving the charge and discharge cycle characteristics of the nonaqueous-electrolyte-based secondary battery, it is described that the deterioration of discharge capacity by repeating charge and discharge cycle is retarded by the employment of lithium or a lithium alloy as an active substance of a negative electrode and by the employment of a positive-electrode plate having a porous structure. However, the description is limited to average pore diameters, any effective configuration as a porous body is not specified, and there is no clear process for production illustrated.

Any of the prior ark processes do not provide a complete resolution, and the current situation is that any of them can hardly be skated as leading to retention of the cycle life satisfactory for enabling practical use.

SUMMARY OF THE INVENTION

The object of the present invention is to provide a porous metal body having a large effective surface area and a high space utilization factor and to provide an excellent filter or battery plate by the use thereof.

The contents of the present invention made for attaining the above object will be described below.

The porous metal body of the present invention contains Al as the principal component, has a porous structure of three-dimensional network provided with interconnected pores at a porosity of 90% or higher and has at least 10 pores per cm, which comprises metallic skeleton parts whose average sectional form satisfies the relationships represented by the following formulae:

$$S1/S2 \leq 2 \text{ and } L1/L2 \leq 0.1$$

wherein

S1=area of a closed region in one metallic skeletal section,

S2=area of a region filled with at least one metal in a closed region in one metallic skeletal section, L1=maximum thickness of one metallic skeletal section, and L2=outer peripheral length of one metallic skeletal section.

The S1/S2 and L1 and L2 of the average sectional form means the average value of S1/S2 or L1/L2 obtained by adding the individual values of S1/S2 or L1/L2 of the respective metallic skeletal sections and dividing the sum by the number of the sections.

The configuration of a representative porous metal body of the present invention as defined by the above formulae is as shown in FIG. 1 and is larger in the effective surface area than those of the conventional porous structures as shown in FIG. 2(a) and (b). This together with the possession of interconnected pores at a high porosity provides a structure highly effective in use in filters and carriers for battery plates, etc. Moreover, the porous metal body of the present invention has excellent oxidation and corrosion resistances because its principal component is Al, so that it can be employed in uses where the conventional porous bodies of Ni have not been of avail.

With respect to the porous structure of the present invention, its mechanical strength can be ensured and its structural stability brought about by containing one or more metal elements other than Al. It is preferred that at least one element selected from the group consisting of Bi, Ca, Co, Cu, Fe, Ge, In, La, Li, Mg, Mn, Ni, Si, Sn and Zn be employed as the above metal element. The presence of such elements other than Al would occasionally be detrimental to the corrosion resistance, etc., depending on the environment.

Thus, as another feature of the present invention, a structure of porous metal body is proposed in which a second element has its concentration distribution high in the center of the metal skeleton and has its concentration lowered at the surface of the skeleton, i.e., the part brought into direct contact with the outside environment. A porous metal body having its structural stability ensured and freed of the corrosion and other problems can be obtained by virtue of the above structure.

Now, the process for producing the above porous metal body will be described.

In the process for producing the above-mentioned porous metal body according to the present invention, first, a coating film of at least one metal capable of forming a eutectic alloy at temperatures not higher than the melting point of Al is formed on the skeleton of a foamed resin having a three-dimensional network structure such as polyurethane foam according to the plating, vapor deposition, sputtering, CVD or other vapor phase process. The thickness of the above coating film is preferred to be not greater than 5 μm from the viewpoint of its effect and practicability. It is preferred that at least one element selected from the group consisting of Bi, Ca, Co, Cu, Fe, Ge, In, La, Li, Mg, Mn, Ni, Si, Sn and Zn be employed as the above metal.

Subsequently, the above foamed resin having the coating film formed thereon is immersed in a paste comprising powdery Al, a resin as a binder and an organic solvent and passed through an interstice between rolls to thereby form a coating film comprising powdery Al containing organic components such as the binder. The thickness of the coating film can be easily regulated by controlling the roll gap. Thereafter, the composite is heated in a nonoxidizing atmosphere, thereby burning the organic components and sintering the powdery Al. Thus, a porous metal body is obtained. The heating is conducted at a temperature ranging from 550° C. to 750° C. The temperature is preferred to range from 620° to 700° C. Although the heating may be conducted in a vacuum atmosphere, $N_2$, Ar and $H_2$ atmospheres are preferred from the economic point of view.

In substitution for the above powdery Al, a powdery mixture of the powdery Al and powder of at least one metal selected from the group consisting of Bi, Ca, Co, Cu, Fe, Ge, In, La, Li, Mg, Mn, Ni, Si, Sn and Zn, powder of an alloy of Al and at least one metal selected from the group consisting of Bi, Ca, Co, Cu, Fe, Ge, In, La, Li, Mg, Mn, Ni, Si, Sn and Zn or a mixture of the powdery Al and this alloy powder can be used as the metal component of the paste. It is preferred that the ratio of the metal component other than Al of the finally obtained porous metal body be 20% by weight or below for ensuring the excellent properties of Al such as lightweight and oxidation and corrosion resistances.

The thus obtained porous metal body of the present invention is used as a positive-electrode core plate in a battery provided with a chargeable positive electrode, a chargeable negative electrode and a lithium-ion-containing nonaqueous electrolyte.

DETAILED DESCRIPTION OF THE PREFERRED EMBODIMENTS

Figure 1:
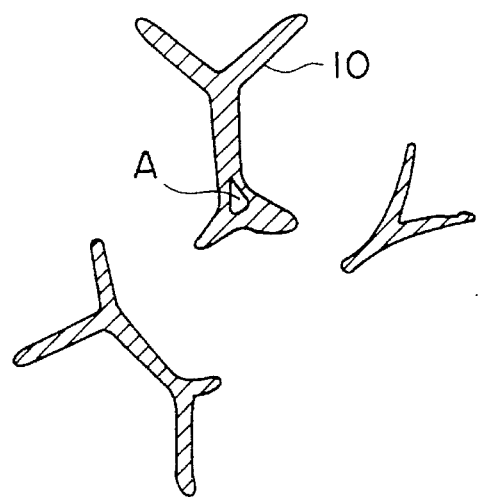
FIG. 1 is a schematic view of a skeletal section of the porous metal body of the present invention.

With respect to the structure of the porous metal body of the present invention as shown in FIG. 1, the principal component of the porous metal body is Al having excellent oxidation and corrosion resistances, so that the porous metal body can be used in application fields where the conventional porous bodies of Ni have been of no avail. Further, having a high space utilization factor and a large surface area ensures effective action in uses in filters and carriers for battery plates, etc. The function of the porous metal body of the present invention in the secondary Li battery will be described below.

The employment of the Ni-made continuous porous metal body having interconnected pores and a three-dimensional network in the positive-electrode plate of the secondary Li battery has advantages in that three-dimensional continuous pores are provided at a porosity of 90% or higher, so that not only can the active substance be filled in the pore space but also the retention of the active substance in the network space is excellent. However, actually, the Ni-made porous metal body cannot be of avail because it is dissolved when the charging voltage of the chargeable oxide for use as an active substance of the positive electrode is as high as over 3 V. On the other hand, the porous metal body of the present invention comprises Al as the principal component, so that it is not dissolved even when the charging voltage exceeds 3 V with the result that the duration of charge and discharge cycle can be prolonged. Another marked effect of the present invention resides in that the porous metal body of the present invention is free of a dead space A such as corresponding part A of FIG. 2(a) to thereby have a high space utilization factor and its effective surface area is large as compared with that of the conventional porous body, so that not only can the active substance material be filled therein in an increased ratio but also the area of contact between the active substance material and the metallic skeletal part 10 is increased with the adherence therebetween improved. Thus, a large effective space results to thereby increase the filling ratio of the active substance material. Further, a large contact area results to thereby impart capability of conducting electrons with the result that the amount of conductive material to be added can be reduced. These two advantages contribute to an increase of the real fill of the active substance material. Still further, the falling of the active substance and conductive material from the plate at the repetition of charge and discharge cycle can be avoided, so that the deterioration of output characteristics and capacity can be suppressed, thereby enabling striking prolongation of the duration of charge and discharge cycle. Furthermore, the structure is realized in which the positive-electrode materials are filled in the three-dimensional network structure composed of Al having high heat conductivity, so that the heat conductivity of the positive-electrode plate as a whole is improved to thereby achieve improvement in respect of the reliability lowering and life shortening attributed to local heat build-up.

Below, the function and effect of the process of the present invention will be described.

The process for producing a porous metal body according to the present invention is one in which powdery Al whose sintering is difficult because of the presence of a strong oxide film at the surface thereof is sintered to thereby obtain a porous metal body. The characteristic feature of this process resides in forming a coating film of a second metal element (i.e., at least one selected from the group consisting of Bi, Ca, Co, Cu, Fe, Ge, In, La, Li, Mg, Mn, Ni, Si, Sn and Zn) capable of forming a eutectic alloy with Al at temperatures not higher than the melting point of Al on a foamed resin having a three-dimensional network structure.

The powdery Al applied onto the metal coating film induces a eutectic reaction at the interface between the powdery Al and the sublayer metal coating film during the heating treatment to thereby produce a liquid phase surface at temperatures not higher than the melting point of Al. This partially produced liquid phase surface breaks the Al oxide film to thereby progress the sintering of the powdery Al while maintaining the skeletal structure of three-dimensional network.

Figure 3:
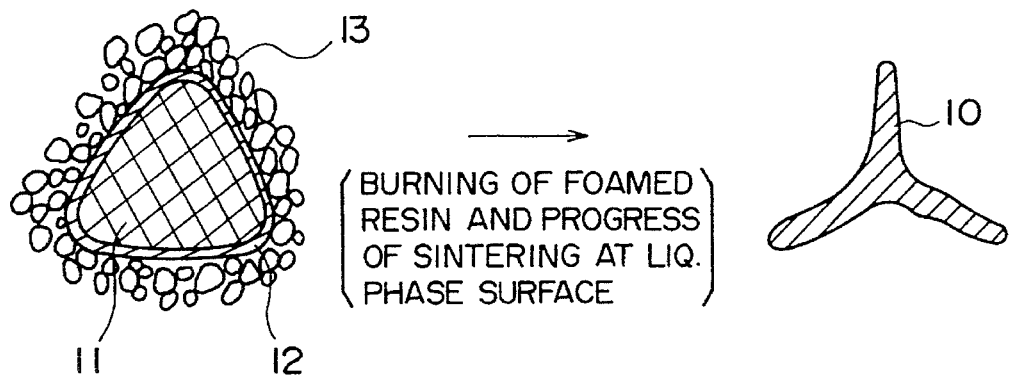
FIG. 3 is a schematic view of skeletal sectional forms observed before and after a sintering step in the process of the present invention.

The metal coating film is present nearly throughout the entire surface of the sublayer coated with the powdery Al, so that the eutectic reaction occurs uniformly throughout the entire surface of the sublayer and the metal coating film partly remains. Consequently, sintering shrinkage scarcely occurs along the intra-skeletal-surface direction with shrinkage occurring only along the thickness direction (direction from applied powdery Al toward the sublayer film). FIG. 3 is a schematic view of the configurations of skeletal sections which would appear before and after the sintering in accordance with the above contemplated mechanism.

Therefore, size shrinkage scarcely occurs after the sintering, so that the configuration results in which the resin core skeleton part occupied by the foamed resin 11 before the sintering is filled (not shown) with the metal part 10. In FIG. 3, numerals 12 and 13 represent the metal coating film and the powdery Al, respectively. Thus, the structure of the porous metal body of the present invention can be obtained.

Figure 2:
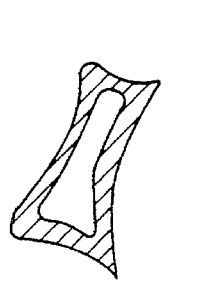
FIG. 2 is typical skeletal sections of the conventional porous body of Ni prepared according to the plating process, in which part (a) shows a hollow section and part (b) a solid section.
Figure 2:
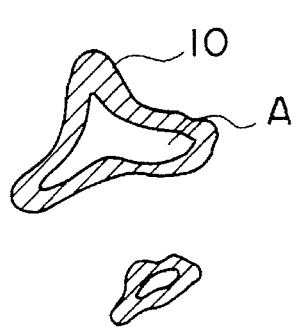
Figure 2:
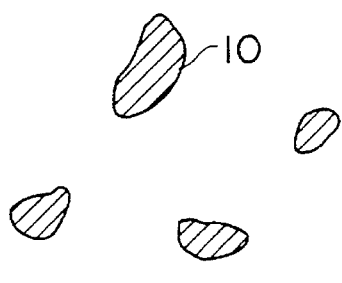

The above phenomenon occurs according to the above mechanism, so that it is observed only when the metal coating film 12 is formed on the foamed resin. For example, when a powdery mixture composed of the above metal element capable of forming a eutectic alloy and dispersed in powdery form in the powdery Al is applied in substitution for the coating film, isotropic sintering shrinkage occurs with the result that only the skeletal sectional form as shown in FIG. 2(b) is obtained.

The above process of the present invention leads to the presence of the second metal element(s) constituting the coating metal film at high concentrations in the center of the skeleton, so that, as another feature of the porous metal structure of the present invention, the structure of porous metal body can be obtained in which the second element has its concentration distribution high in the center of the metal skeleton and has its concentration lowered at the surface of the skeleton, i.e., the path brought into direct contact with the outside environment.

Not only can the same effect as above be obtained but also a sinterability improving effect is exerted by the use of, in substitution for the above powdery Al, a powdery mixture of the powdery Al and powder of the second metal element, powder of an alloy of Al and the second metal element or a powdery mixture of the powdery Al and this alloy powder in accordance with the other feature of the present invention.

The present invention will be illustrated below with reference to the following Examples.

EXAMPLE 1

A metal coating film of Cu was formed at an amount of 5 g/m$^2$ on polyurethane foam having a thickness of 1.5 mm and provided with about 20 pores per cm according to the electroless plating process.

Powdery Al of 16 μm in average particle size were blended with the compounding agents specified in Table 1 in the proportions also specified therein and mixed by means of a ball mill for 12 hr, thereby obtaining a paste.

TABLE 1

| Compounding agent | Proportion |
| --- | --- |
| powdery Al (average particle size: 16 μm) | 50 wt % |
| acrylic resin | 8 wt % |
| 2-(2-n-butoxyethoxy)ethanol | 42 wt % |

The polyurethane foam having the coating film of Cu formed thereon was impregnated with the paste specified in Table 1, freed of excess impregnation coating by means of a squeezing extractor and dried in the air at 150° C. for 10 min. Thereafter, the coating product was heated to 650° C. at a temperature rise rate of 10° C./min in a stream of $N_2$, and heating treatment was conducted at 650° C. for 1 hr. Thus, a porous metal body of tile present invention was obtained.

As a comparative example, a porous metal body was prepared in the same manner as in the above Example, except that the polyurethane foam was not provided with a coating film of Cu and that a paste was prepared with the use of the compounding agents specified in Table 2 in which powdery Cu having an average particle size of about 10 μm was used in combination with powdery Al in the proportions also specified in Table 2.

TABLE 2

| Compounding agent | Proportion |
| --- | --- |
| powdery Al (average particle size: 16 μm) | 48.2 wt% |
| powdery Cu (average particle size: 10 μm) | 1.8 wt % |
| acrylic resin | 8 wt % |
| 2-(2-n-butoxyethoxy)ethanol | 42 wt % |

Figure 4:
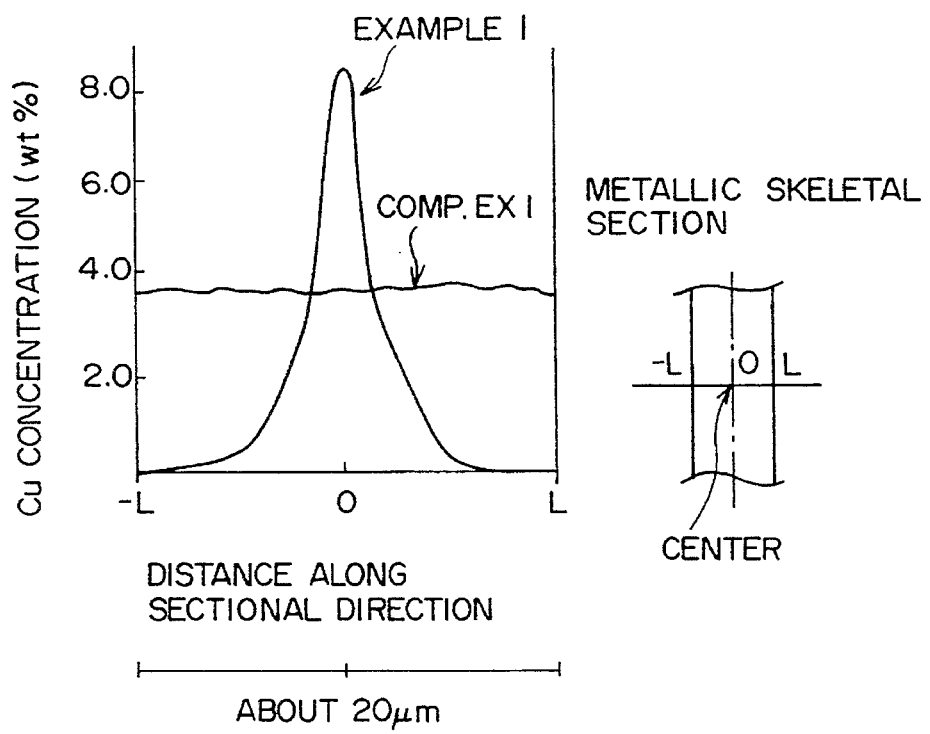
FIG. 4 is a view showing the Cu profiles of skeletal section parts of Example 1 and Comparative Example 1.

The properties of the above porous metal bodies are given in Table 3. The Cu profile at a skeletal section part was examined by an electron probe micro analyzer and the result is shown in FIG. 4.

TABLE 3

| Sample No. | Weight (g/m²) | Porosity (%) | No. of pores *1 | Amount of Cu (wt. %) | Sectional form *2 S1/S2 | L1/L2 |
| --- | --- | --- | --- | --- | --- | --- |
| 1 | 143 | 95 | 20 | 3.5 | 1.1 | 0.04 |
| 2 (Comp. Ex.) | 145 | 93 | 25 | 3.5 | 1.3 | 0.21 |

*1 Number of pores per cm, and
*2 Skeletal sections were cut out and the average values of S1/S2 and L1/L2 were calculated with respect to 10 skeletal sectional forms.
S1 = area of a closed region in one metallic skeletal section,
S2 = area of a region filled with at least one metal in a closed region in one metallic skeletal section,
L1 = maximum thickness of one metallic skeletal section, and
L2 = outer peripheral length of one metallic skeletal section.

EXAMPLE 2

The performance as a battery plate of each of the porous metal bodies prepared in Example 1 was evaluated.
Preparation of positive electrode:

LiCoO₂ was employed as an active substance of positive electrode. 95% by weight of $LiCoO_2$ was mixed with 2% by weight of acetylene black as a conductive agent and then mixed together with 3% by weight of polytetrafluoroethylene resin as a binder. The polytetrafluoroethylene resin was added in the form of an aqueous dispersion. The resultant pasty mixture was filled in the three-dimensional pores of each of the porous metal bodies prepared in Example 1 (Nos. 1 and 2), and compression molding was carried out into a thickness of 0.4 mm.
Preparation of negative electrode:

Powdery graphite and polyethylene terephthalate were milled together, applied to both sides of a copper foil of 15 μm in thickness as a negative-electrode plate and dried, followed by compression molding into a thickness of 0.4 mm. Thus, a negative electrode was obtained.
Preparation of nonaqueous electrolyte:

$LiPF_6$ (lithium hexafluorophosphate) as a solute was dissolved in ethylene carbonate (EC) as a solvent in a concentration of 1 mol/l, thereby obtaining a nonaqueous electrolyte.
Preparation of secondary nonaqueous electrolyte battery:

A cylindrical battery (battery size: 14.2 mm in diameter and 50.0 mm in length) was prepared from the above positive and negative electrodes and nonaqueous electrolyte.

Figure 5:
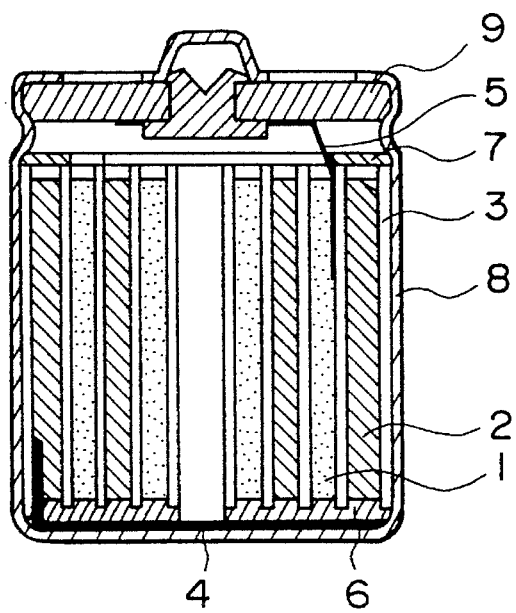
FIG. 5 is an explanatory sectional view showing one form of the structure of a battery having the plate of the present invention employed therein.

A microporous film of polypropylene having a three-dimensional pore structure (trade name "CELGARD 3401" produced by Polyplastics Co., Ltd.) was used as a separator. This separator was impregnated with the above nonaqueous electrolyte, and a battery constructed as shown in FIG. 5 was produced. An electrode body was formed by providing positive electrodes 1 and negative electrodes 2, disposing a strip separator 3 having a width greater than those of the electrode plates between neighboring positive and negative electrodes and spirally winding the whole. The electrode body had its top and bottom parts respectively provided with insulating polypropylene plates 6, 7 and was inserted in a case 8. A step part was formed at an upper part of the case 8, the electrolyte was poured therein and a sealing plate 9 was applied for sealing. Thus, batteries were prepared. In this figure, numerals 4 and 5 represent a negative-electrode lead plate and a positive-electrode lead plate, respectively.

The battery in which use was made of porous metal body No. 1 was designated battery B1 and the battery in which use was made of porous metal body No. 2 (Comparative Example) designated battery B2.

As another comparative example, battery B3 was prepared in which an aluminum foil of 20 μm in thickness was used as a positive-electrode plate according to the prior art process. 85% by weight of $LiCoO_2$ as an active substance of positive electrode, 10% by weight of acetylene black as a conductive agent and 5% by weight of polytetrafluoroethylene resin as a binder were mixed together. The polytetrafluoroethylene resin was added in the form of an aqueous dispersion. The resultant pasty mixture was uniformly applied onto both sides of the aluminum foil and dried, followed by compression molding by means of a roller press into a positive electrode with a thickness of 0.4 mm. Except for the positive electrode, the battery was constructed in the same manner as in Example 1 according to the present invention.

In battery evaluation tests, the energy density was measured and further the change of battery capacity was measured which occurred when the charge and discharge cycle was repeated in the charge and discharge cycle test in which one cycle consisted of charging of 100 mA current to a charging ending voltage of 4.2 V followed by discharging of 100 mA current to a discharging ending voltage of 3.0 V. Each test was conducted with respect to 10 cells, and an average was calculated for comparison.

Figure 6:
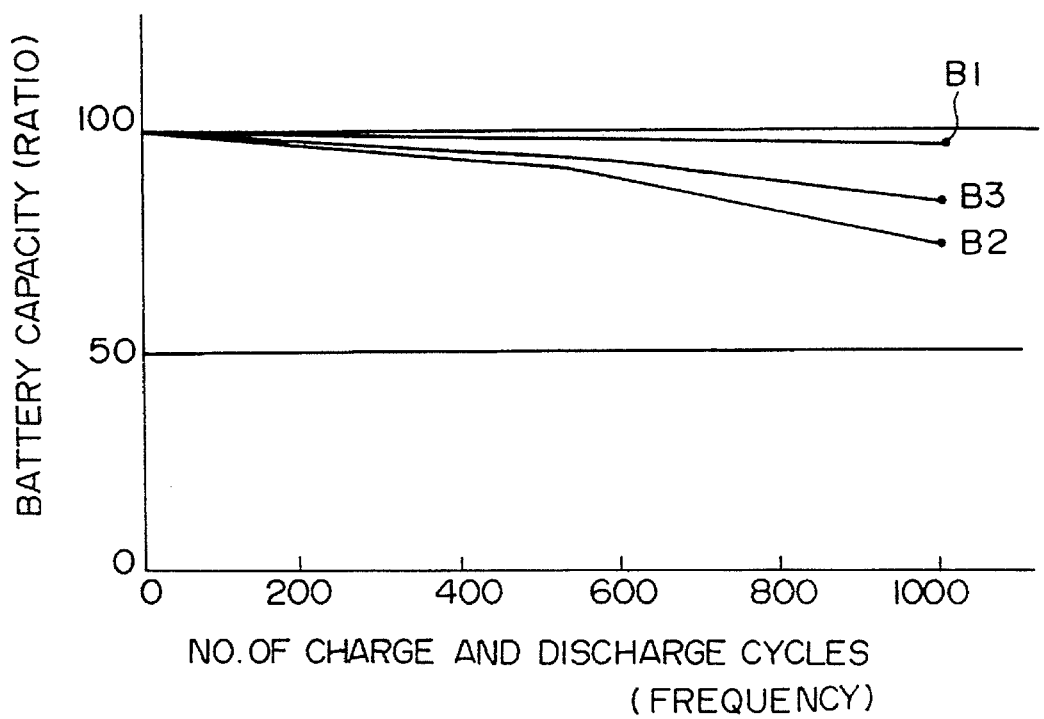
FIG. 6 is a graph showing the cycle characteristics evaluated for the batteries according to the present invention and comparative examples.

For each battery, the energy density result is given in Table 4 and the cycle characteristic evaluation result is shown in FIG. 6.

TABLE 4

|  | Energy density (Wh/L) |
|---|---|
| B1 (Invention) | 340 |
| B2 (Comp. Ex.) | 320 |
| B3 (Comp. Ex.) | 280 |

FIG. 6 is a graph in which the charge and discharge cycle characteristic of each battery is shown by the change of battery capacity caused by the change in the number of cycles relative to the battery capacity at first cycle employed as a reference on the axis of ordinate.

As apparent from Table 4, batteries B1 and B2. in each of which use was made of a plate with a porous structure are endowed with relatively large energy densities. Further, although identical in respect of the use of a porous metal body, the battery B1 having the porous metal body of the present invention incorporated therein is endowed with higher energy density. This is attributed to the porous body No. 1 having larger effective surface area.

The results of FIG. 6 show that, as compared with the conventional battery B3 having an aluminum foil employed therein (provided as a comparative example) which retains at least 80% of the initial capacity even after 1000 cycles, the battery B1 of the present invention retains at least 90% of the initial capacity even after 1000 cycles, thereby attesting to the cycle life prolonged in the present invention. The battery B2 has the greatest capacity lowering. This would have been caused by leaching of Cu from the porous metal body No. 2.

In the foregoing Examples, $LiCoO_2$, graphite and the ethylene carbonate solution having 1 mol/l lithium hexafluorophosphate dissolved therein were employed as a positive electrode, a negative electrode and an electrolyte, respectively. The positive electrode, negative electrode and electrolyte for use in the secondary nonaqueous electrolyte battery of the present invention are not limited to those employed in the above Examples. The positive electrode can be one containing $LiMn_2O_4$, $LiNiO_2$ or the like in place of $LiCoO_2$, and the negative electrode can be one containing any of carbon materials capable of being doped or dedoped with metallic lithium, lithium alloys and lithium ions.

In the foregoing Examples, embodiment of the present invention has been described in connection with the application to a cylindrical secondary nonaqueous electrolyte battery. However, there is no particular limit in the configuration of the battery. The present invention can be applied to secondary nonaqueous electrolyte batteries of various configurations, for example, flat and angular configurations.

EXAMPLE 3

Various porous metal bodies were produced with the use of the same polyurethane foam as in Example 1 but with the type of coating metal and the type of metal powder in paste being varied. The details thereof are specified in Table 5.

TABLE 5

| Sample No. | Coating metal *1 | Metal powder of paste *2 | Heat treatment condition *3 |
|---|---|---|---|
| 3 | Bi, 3 g/m² | Al (50 wt %) | in Ar, 630° C., 30 min |
| 4 | In, 4 g/m² | Al (50 wt %) | in Ar, 600° C., 1 hr |
| 5 | Si, 7 g/m² | Al (50 wt %) | in N₂, 670° C., 20 min |
| 6 | Mn, 2 g/m² | Al (50 wt %) | in Ar, 580° C., 1 hr |
| 7 | Cu, 2 g/m² | Al (48 wt %) Mg (2 wt %) | in H 630° C., 30 min |
| 8 | Si, 4 g/m² | Al (49 wt %) Mn (1 wt %) | in Ar, 590° C., 1 hr |
| 9 | Sn, 5 g/m² | Al—Mg (2%) alloy (50 wt %) | in Ar, 710° C., 10 min |
| 10 | Fe, 3 g/m² | A—Mn (1%) alloy (50 wt %) | in N , 730° C., 5 min |
| 11 | Ni, 1 g/m² | Al—Si(20%) alloy (10 wt %) | in Ar, 630° C., 30 min |
| 12 | Mn, 2 g/m² | Al—Ca(10%) alloy (20 wt %) Al (30 wt %) | in Ar, 600° C., 1 hr |

*1 The coatings were all formed by the vapor deposition process.
*2 The components other than metal powder or alloy were the same as specified in Table 1.
*3) The temperature rise rate was the same as in Example 1.

The sectional form of each of the obtained porous metal bodies was examined in the same way as described in Example 1 and the result is given in Table 6.

TABLE 6

| | Sectional form | |
|---|---|---|
| Sample No. | S1/S2 | L1/L2 |
| 3 | 1.2 | 0.03 |
| 4 | 1.1 | 0.02 |
| 5 | 1.3 | 0.05 |
| 6 | 1.7 | 0.08 |
| 7 | 1.4 | 0.06 |
| 8 | 1.3 | 0.02 |
| 9 | 1.1 | 0.03 |
| 10 | 1.1 | 0.01 |
| 11 | 1.3 | 0.04 |
| 12 | 1.4 | 0.06 |

Table 6 demonstrates that a porous metal body having a large effective surface area can be obtained by the process of the present invention.

The porous metal body of the present invention has a large effective surface area and a high space utilization factor, s o that it exhibits very excellent performance in uses in filters and carriers for battery plates, etc.

What is claimed is:

1. A porous metal body containing Al as the principal component, having a porous structure of three-dimensional network provided with interconnected pores at a porosity of 90% or higher and having at least 10 pores per cm, which comprises metallic skeleton parts whose average sectional form satisfies the relationships represented by the following formulae:

$$S1/S2 \leq 2 \text{ and } L1/L2 \leq 0.1$$

wherein
S1=area of a closed region in one metallic skeletal section,
S2=area of a region filled with at least one metal in a closed region in one metallic skeletal section,
L1=maximum thickness of one metallic skeletal section, and L2=outer peripheral length of one metallic skeletal section.

2. The porous metal body as defined in claim 1, wherein the metallic skeleton part of the porous metal body has a center in which non-Al metallic elements have a high concentration distribution as compared to that at the surface of the skeleton.

3. A process for producing a porous metal body, which comprises forming a coating film of at least one metal capable of forming a eutectic alloy at temperatures not higher than the melting point of Al on a foamed resin skeleton having a three-dimensional network structure according to a plating process or a vapor phase process, impregnating the foamed resin having said coating film formed thereon with a paste comprising powdery Al, a binder and an organic solvent as principal components to thereby obtain a paste-coated composite and heating the composite at a temperature ranging from 550° C. to 750° C. in a nonoxidizing atmosphere.

4. A process for producing a porous metal body, which comprises forming a coating film of at least one metal capable of forming a eutectic alloy at temperatures not higher than the melting point of Al on a foamed resin skeleton having a three-dimensional network structure according to a plating process or a vapor phase process, impregnating the foamed resin having said coating film formed thereon with a paste comprising powdery Al, said metal in powdery form, a binder and an organic solvent as principal components to thereby obtain a paste-coated composite and heating the composite at a temperature ranging from 550° C. to 750° C. in a nonoxidizing atmosphere.

5. A process for producing a porous metal body, which comprises froming a coating film of at least one metal capable of forming a eutectic alloy at temperatures not higher than the melting point of Al on a foamed resin skeleton having a three-dimensional network structure according to a plating process or a vapor phase process, impregnating the foamed resin having said coating film formed thereon with a paste comprising a powdery Al alloy containing said metal, a binder and an organic solvent as principal components to thereby obtain a paste-coated composite and heating the composite at a temperature ranging from 550° C. to 750° C. in a nonoxidizing atmosphere.

6. A process for producing a porous metal body, which comprises forming a coating film of at least one metal capable of forming a eutectic alloy at temperatures not higher than the melting point of Al on a foamed resin skeleton having a three-dimensional network structure according to a plating process or a vapor phase process, impregnating the foamed resin having said coating film formed thereon with a paste comprising powdery Al, a powdery Al alloy containing said metal, a binder and an organic solvent as principal components to thereby obtain a paste-coated composite and heating the composite at a temperature ranging from 550° C. to 750° C. in a nonoxidizing atmosphere.

7. A battery plate comprising a porous metal body for use as a positive electrode in a battery provided with a nonaqueous electrolyte containing lithium ions, in which said porous metal body contains Al as a principal component, has a porous structure of three-dimensional network provided with interconnected pores at a porosity of 90% or higher and has at least 10 pores per cm, said porous metal body comprising metallic skeleton parts whose average sectional form satisfies the relationships represented by the following formulae:

$$S1/S2 \leq 2 \text{ and } L1/L2 \leq 0.1$$

wherein

S1=area of a closed region in one metallic skeletal section,

S2=area of a region filled with at least one metal in a closed region in one metallic skeletal section, L1=maximum thickness of one metallic skeletal section, and L2=outer peripheral length of one metallic skeletal section.

8. The battery plate as defined in claim 7, wherein the metallic skeleton part of the porous metal body has a center in which non-Al metallic elements have a high concentration distribution as compared to that at the surface of the skeleton.

* * * * *